(12) United States Patent
Hirayama et al.

(10) Patent No.: US 11,732,188 B2
(45) Date of Patent: Aug. 22, 2023

(54) COMPOSITION COMPRISING A SEMICONDUCTING LIGHT EMITTING NANOPARTICLE

(71) Applicant: MERCK PATENT GMBH, Darmstadt (DE)

(72) Inventors: Yuki Hirayama, Tokyo (JP); Tomohisa Goto, Kanagawa (JP); Tadashi Kishimoto, Kanagawa (JP); Masayoshi Suzuki, Tokyo (JP); Teruaki Suzuki, Kanagawa (JP)

(73) Assignee: MERCK PATENT GMBH, Darmstadt (DE)

( * ) Notice: Subject to any disclaimer, the term of this patent is extended or adjusted under 35 U.S.C. 154(b) by 503 days.

(21) Appl. No.: 16/768,259

(22) PCT Filed: Nov. 20, 2018

(86) PCT No.: PCT/EP2018/081880
§ 371 (c)(1),
(2) Date: May 29, 2020

(87) PCT Pub. No.: WO2019/105798
PCT Pub. Date: Jun. 6, 2019

(65) Prior Publication Data
US 2021/0363421 A1    Nov. 25, 2021

(30) Foreign Application Priority Data

Nov. 30, 2017 (EP) .................................... 17204654

(51) Int. Cl.
| | | |
|---|---|---|
| *H01L 51/00* | (2006.01) |
| *C09K 11/88* | (2006.01) |
| *C08L 83/04* | (2006.01) |
| *C09K 11/02* | (2006.01) |
| *C09K 11/77* | (2006.01) |
| *H01L 33/50* | (2010.01) |
| *B82Y 20/00* | (2011.01) |
| *B82Y 30/00* | (2011.01) |
| *B82Y 40/00* | (2011.01) |

(52) U.S. Cl.
CPC ............ *C09K 11/883* (2013.01); *C08L 83/04* (2013.01); *C09K 11/02* (2013.01); *C09K 11/7715* (2013.01); *C09K 11/7774* (2013.01); *H01L 33/50* (2013.01); *B82Y 20/00* (2013.01); *B82Y 30/00* (2013.01); *B82Y 40/00* (2013.01)

(58) Field of Classification Search
CPC ... C09K 11/883; C09K 11/02; C09K 11/7715; C09K 11/7774; C08L 83/04; H01L 33/50; H01L 51/00
See application file for complete search history.

(56) References Cited

U.S. PATENT DOCUMENTS

| | | |
|---|---|---|
| 6,809,781 B2 | 10/2004 | Setlur et al. |
| 8,035,590 B2 | 10/2011 | Kakinuma et al. |
| 8,394,976 B2 | 3/2013 | Pickett et al. |
| 9,529,228 B2 | 12/2016 | Banin et al. |
| 10,509,319 B2 | 12/2019 | Suzuki et al. |
| 2004/0007169 A1 | 1/2004 | Ohtsu et al. |
| 2011/0084250 A1 | 4/2011 | Jang et al. |
| 2012/0087107 A1 | 4/2012 | Kunimasa et al. |
| 2018/0371313 A1 | 12/2018 | Aksit et al. |
| 2019/0016952 A1 | 1/2019 | Qiu et al. |

FOREIGN PATENT DOCUMENTS

| | | |
|---|---|---|
| EP | 1403355 A1 | 3/2004 |
| EP | 2056158 A2 | 5/2009 |
| JP | 2003286292 A | 10/2003 |
| JP | 2012507588 A | 3/2012 |
| JP | 2014174406 A | 9/2014 |
| WO | 2006027956 A1 | 3/2006 |
| WO | 10143461 A1 | 12/2010 |
| WO | 12059931 A1 | 5/2012 |
| WO | 14129067 A1 | 8/2014 |
| WO | 16134820 A1 | 9/2016 |
| WO | 17116820 A1 | 7/2017 |
| WO | 17117162 A1 | 7/2017 |

OTHER PUBLICATIONS

International Search report PCT/EP2018/081880 dated Jan. 25, 2019 pp. 1-4.
Search report in corresponding CN Application No. 201880076918.0 dated Aug. 24, 2022 (pp. 1-11) and English translation thereof (pp. 1-13).
English translation of Office Action in corresponding JP2020529569 dated Nov. 11, 2022 (pp. 1-4).

*Primary Examiner* — Victor A Mandala
*Assistant Examiner* — Colleen E Snow
(74) *Attorney, Agent, or Firm* — Millen, White, Zelano & Branigan, P.C.; Harry B. Shubin

(57) ABSTRACT

The present invention relates to a composition comprising a semiconducting light emitting nanoparticle.

21 Claims, No Drawings

COMPOSITION COMPRISING A SEMICONDUCTING LIGHT EMITTING NANOPARTICLE

FIELD OF THE INVENTION

The present invention relates to a composition comprising a semiconducting light emitting nanoparticle, formulation, use of a composition, use of a formulation, an optical medium, and an optical device.

BACKGROUND ART

WO 2014/129067 A1 discloses a formulation consisting of a resin selected from resin A to K in table 1 and in table 2, semiconductor quantum dots selected from A to D in table 1 and table 2, and a solvent selected from the solvent 1 to 6 of table 1 and table 2.

WO 2012/059931A1 describes a mixture of nanorods, a monomer solution of polyvinyl butyral and toluene.

EP 01403355 A discloses a composition of a phosphor mixture and polymer matrix.

EP 02056158 A describes a mixture of phosphor particles and a binder (an ethyl cellulose or a silicone resin).

WO 2010/143461 A1 discloses a mixture of phosphor and a resin such as an acryl resin.

PATENT LITERATURE

1. WO 2014/129067 A1
2. WO 2012/059931 A1
3. EP 01403355 A
4. EP 02056158 A
5. WO 2010/143461 A1

SUMMARY OF THE INVENTION

However, the inventors newly have found that there is still one or more of considerable problems for which improvement is desired, as listed below.

1. A novel composition comprising one or more of semiconducting light emitting nanoparticles and silicone resin showing improved dispersibility of said semiconducting light emitting nanoparticles in the silicone resin, is desired.
2. A novel composition comprising one or more of semiconducting light emitting nanoparticles and silicone resin reducing or preventing polymerization of the silicone resin when storing it, is requested.
3. A novel composition comprising one or more of semiconducting light emitting nanoparticles and silicone resin showing long term stability and stable Quantum Yield of said semiconducting light emitting nanoparticles in the composition or the formulation, is requested
4. A novel composition comprising one or more of semiconducting light emitting nanoparticles, showing better dispersibility of the semiconducting light emitting nanoparticles at higher concentration, is requested.

The inventors aimed to solve one or more of the above-mentioned problems 1 to 4.

Then it is found a novel composition comprising, essentially consisting of, or consisting of, at least one semiconducting light emitting nanoparticle comprising at least a core, optionally one or more shell layers, a polymer comprising, essentially consisting of, or consisting of, at least an attaching group selected from one or more member of the group consisting of phosphine groups, phosphine oxide groups, phosphate groups, phosphonate groups, thiol groups, carboxyl groups, hetero cyclic groups, silane groups, sulfonic acids, hydroxyl groups, and phosphonic acids, preferably a phosphonate group, a phosphate group, a carboxyl group, and a thiol group, more preferably a phosphate group represented by following chemical formula (I),

and a $1^{st}$ repeating unit represented by following chemical formula (II); (III), (IV), (V), (VI), (VII) or (VIII),

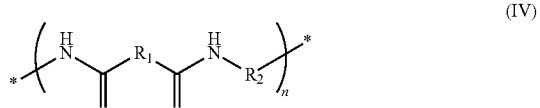

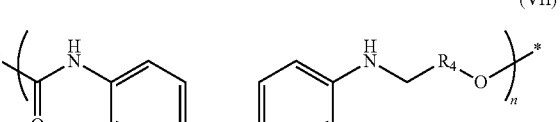

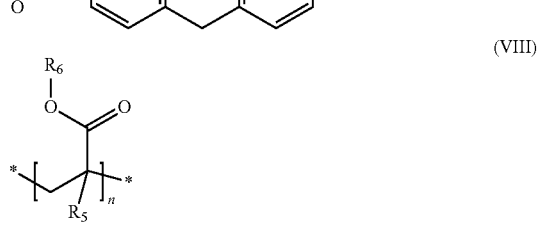

wherein, $R_1$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_2$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_3$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_4$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_5$ is a hydrogen atom, or methylene;

$R_6$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

"*" represents a connecting point; "n" is an integer, preferably n is 1 to 1000, preferably 5 to 500, more preferably 10 to 100, and a poly siloxane, preferably said poly siloxane is an organo polysiloxane, more preferably the polysiloxane comprises at least a silsesquioxane unit represented by following chemical formula (IX):

$$(R_7SiO_{1.5})_x \quad\quad\quad (IX)$$

wherein $R_7$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another, the symbol x is an integer, preferably x is in the range from 1 to 1000, more preferably from 5 to 500, even more preferably from 5 to 100.

In another aspect, the present invention relates to formulation comprising at least the composition, and a solvent, preferably said solvent is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; more preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

In another aspect, the present invention also relates to use of the composition, or the formulation, in an electronic device, optical device, in a biomedical device or for fabricating an electronic device, optical device or a biomedical device.

In another aspect, the present invention further relates to an optical medium comprising said composition or the formulation.

In another aspect, the present invention further relates to an optical device comprising said optical medium.

DETAILED DESCRIPTION OF THE INVENTION

According to the present invention, the composition comprising, essentially consisting of, or consisting of;

at least one semiconducting light emitting nanoparticle comprising at least a core, optionally one or more shell layers, a polymer comprising, essentially consisting of, or consisting of, at least an attaching group selected from one or more member of the group consisting of phosphine groups, phosphine oxide groups, phosphate groups, phosphonate groups, thiol groups, carboxyl groups, hetero cyclic groups, silane groups, sulfonic acids, hydroxyl groups, and phosphonic acids, preferably a phosphonate group, a phosphate group, a carboxyl group, and a thiol group, more preferably a phosphate group represented by following chemical formula (I),

and a $1^{st}$ repeating unit represented by following chemical formula (II); (III), (IV), (V), (VI), (VII) or (VIII),

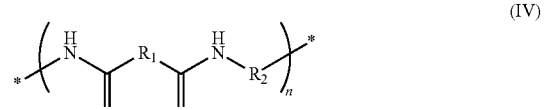

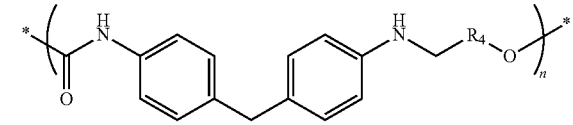

-continued (VIII)

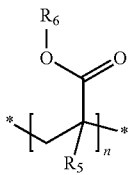

wherein
$R_1$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$,
$R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;
$R_2$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_3$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;
$R_4$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;
$R_5$ is a hydrogen atom, or methylene;
$R_6$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

"*" represents a connecting point; "n" is an integer, preferably n is 1 to 1000, preferably 5 to 500, more preferably 10 to 100, and a poly siloxane, preferably said poly siloxane is an organo polysiloxane, more preferably the polysiloxane comprises at least a silsesquioxane unit represented by following chemical formula (IX):

(IX)

wherein R$_7$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$, R$^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents R$^a$ here may also form a mono- or polycyclic, aliphatic, aromatic or heteroaromatic ring system with one another, the symbol x is an integer, preferably x is in the range from 1 to 1000, more preferably from 5 to 500, even more preferably from 5 to 100.

Polymer

According to the present invention, a wide variety of publicly known polymers comprising at least an attaching group described below and a 1$^{st}$ repeating unit, can be used preferably.

Thus, in some embodiments of the present invention, the polymer of the composition comprises at least an attaching group selected from one or more member of the group consisting of phosphine groups, phosphine oxide groups, phosphate groups, phosphonate groups, thiol groups, carboxyl groups, hetero cyclic groups, silane groups, sulfonic acids, hydroxyl groups, and phosphonic acids, preferably a phosphonate group, a phosphate group, a carboxyl group, and a thiol group, more preferably a phosphate group represented by following chemical formula (I), and

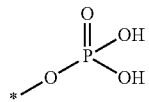
(I)

a 1$^{st}$ repeating unit represented by following chemical formula (II); (III), (IV), (V), (VI), (VII) or (VIII),

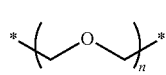
(II)

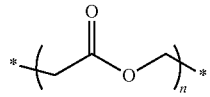
(III)

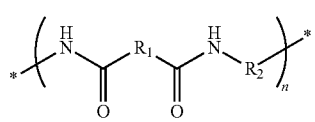
(IV)

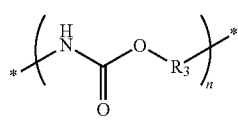
(V)

(VI)

(VII)

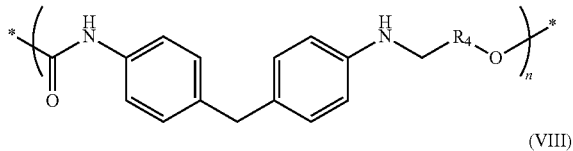
(VIII)

wherein

R$_1$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$, R$^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents R$^a$ here may also form a mono- or polycyclic, aliphatic, aromatic or heteroaromatic ring system with one another;

R$_2$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_3$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_4$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_5$ is a hydrogen atom, or methylene;

R$_6$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

"*" represents a connecting point; "n" is an integer, preferably n is 1 to 1000, preferably 5 to 500, more preferably 10 to 100.

In some embodiment of the present invention, the composition comprises a plurality of semiconducting light emitting nanoparticles.

In a preferred embodiment of the present invention, the polymer further comprising a 2$^{nd}$ repeating unit represented by following chemical formula (II); (III), (IV), (V), (VI), (VII) or (VIII),

(II)

(III)

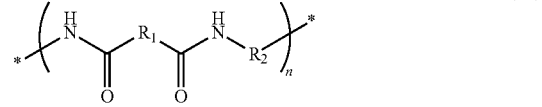

(IV)

-continued

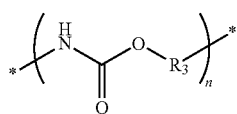

(V)

(VI)

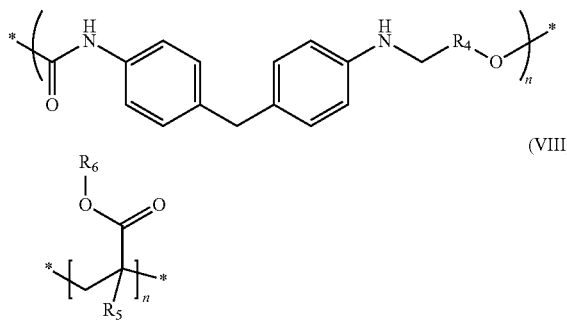

(VII)

(VIII)

wherein

R$_1$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents R$^a$ here may also form a mono- or polycyclic, aliphatic, aromatic or heteroaromatic ring system with one another;

R$_2$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_3$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_4$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals R$^a$, where one or more non-adjacent CH$_2$ groups may be replaced by R$^a$C=CR$^a$, C≡C, Si(R$^a$)$_2$, Ge(R$^a$)$_2$, Sn(R$^a$)$_2$, C=O, C=S, C=Se, C=NR$^a$, P(=O)(R$^a$), SO, SO2, NR$^a$, OS, or CONR$^a$ and where one or more H atoms may be replaced by D, F, Cl, Br, I, CN or NO$_2$, or an aromatic or heteroaromatic ring system having 5 to 60 aromatic ring atoms, which may be substituted by one or more radicals R$^a$;

R$_5$ is a hydrogen atom, or methylene;

R$_6$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to 15 carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to 40 carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

"*" represents the connecting point; "n" is an integer, preferably n is 1 to 1000, preferably 5 to 500, more preferably 10 to 100, and said $1^{st}$ repeating unit and said $2^{nd}$ repeating unit are different of each other; preferably x is in the range from 1 to 1000, more preferably from 5 to 500, even more preferably from 5 to 100.

In a further preferred embodiment of the present invention, the polymer is represented by following formula (X), $$A(B)_xC(D)_yEF \qquad (X)$$

wherein symbol A is the attaching group; symbol B is a $1^{st}$ linker, preferably the $1^{st}$ linker is a linear alkylene group having 1 to 25 carbon atoms, or a linear alkenylene group having 1 to 25 carbon atoms; symbol C is the $1^{st}$ repeating unit; symbol D is a $2^{nd}$ linker, preferably the $2^{nd}$ linker is a linear alkylene group having 1 to 25 carbon atoms, or a linear alkenylene group having 1 to 25 carbon atoms; symbol E is the $2^{nd}$ repeating unit; symbol F is a tail of the polymer, preferably selected from the group consisting of a hydrogen atom, a linear alkyl group having 1 to 25 carbon atoms, a linear alkoxy group having 1 to 25 carbon atoms and a linear alkenyl group having 1 to 25 carbon atoms, preferably a hydrogen atom or a linear alkyl group having 1 to 25 carbon atoms; x is 0 or 1, y is 0 or 1.

Furthermore preferably, said $1^{st}$ repeating unit is represented by formula (III) and the $2^{nd}$ repeating unit is represented by chemical formula (II).

Preferably, symbol B is selected from the group of following table 1.

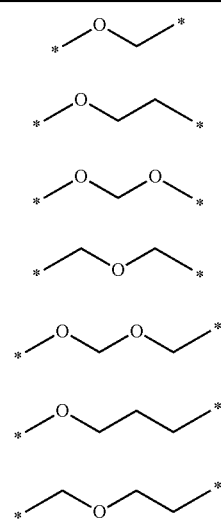

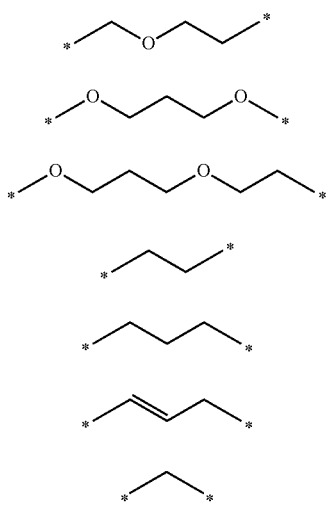

wherein and "*" represents the connecting point to groups A and C.

Preferably, symbol D is selected from the group of following table 2.

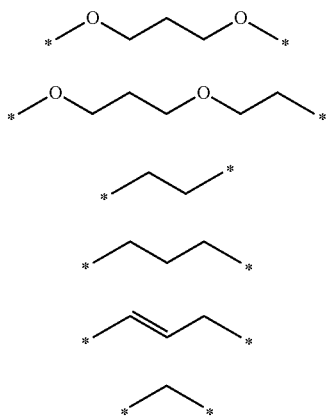

wherein and "*" represents the connecting point to groups C and D.

Furthermore preferably, said $1^{st}$ repeating unit is represented by formula (III) and the $2^{nd}$ repeating unit is represented by chemical formula (II).

For examples, DISPERBYK®-180, 118, 111, 110, 106, 103, 102, more preferably 110, 180, 118, and 103 can be used preferably as the polymer.

Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm and 999 nm, preferably 1 nm to 150 nm, more preferably 3 nm to 50 nm.

Thus, according to the present invention, "semiconducting light emitting nanoparticle" is taken to mean that the light emitting material which size is in between 0.1 nm and 999 nm, preferably 1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 999 nm, preferably 0.5 nm to 150 nm, more preferably 1 nm to 50 nm.

According to the present invention, the term "size" means the average diameter of the longest axis of the semiconducting nanosized light emitting particles.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN:978-3-662-44822-9.

Generally, it is said that the quantum sized materials can emit tunable, sharp and vivid colored light due to "quantum confinement" effect.

In some embodiments of the invention, the size of the overall structures of the quantum sized material, is from 1 nm to 50 nm, more preferably, it is from 1 nm to 30 nm, even more preferably, it is from 5 nm to 15 nm. According to the present invention, said core of the semiconducting light emitting nanoparticle can be varied.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPZnSe, InCdP, InPCdS, InPCdSe, InGaP, InGaPZn, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and a combination of any of these can be used.

In a preferred embodiment of the present invention, the core comprises one element of the group 13 of the periodic table, and one element of the group of the periodic table, preferably the element of the group 13 is In, and the element of the group 15 is P, more preferably the core is represented by the following formula (XII), or formula (XII').

$$In_{1-x}Ga_xZn_zP \quad (XII)$$

wherein 0≤x≤1, 0≤z≤1, even more preferably the core is InP, $InxZn_zP$, or $In_{1-x}Ga_xP$.

A person skilled in the art can easily understand that there is a counter ion in or around the core and thus, the chemical formula (I) is electrically neutral.

$$In_{1-x-2/3z}Ga_xZn_zP \quad (XII')$$

wherein 0≤x≤1, 0≤z≤1, even more preferably the core is InP, $In_{1-2/3z}Zn_zP$, or $In_{1-x}Ga_xP$.

In case of $In_{1-2/3z}Zn_zP$, x is 0, and 0<z≤1. And Zn atom can be directly onto the surface of the core or alloyed with InP. The ratio between Zn and In is in the range between 0.05 and 5. Preferably, between 0.07 and 1.

According to the present invention, a type of shape of the core of the semiconducting light emitting nanoparticle, and shape of the semiconducting light emitting nanoparticle to be synthesized are not particularly limited.

In some embodiments of the present invention, the core is selected from the group consisting of InP, InP: Zn, InPZnS, and InGaP.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, the shell layer is represented by following formula (XI), $$ZnS_xSe_yTe_z, \quad (XI)$$

wherein, 0≤x≤1, 0≤y≤1, 0≤z≤1, and x+y+z=1, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

The ratio of y/x is preferably larger than 0.5, more preferably larger than 1 and even more preferably larger than 2.

The ratio of y/z is preferably larger than 1 and more preferably larger than 2, and even more preferably larger than 4.

In some embodiments of the present invention, the semiconducting light emitting nanoparticle further comprises a $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not the same.

In a preferred embodiment of the present invention, the $2^{nd}$ shell layer is represented by following formula (XI'), $$ZnS_xSe_yTe_z, \quad (XI')$$

wherein, 0≤x≤1, 0≤y≤1, 0≤z≤1, and x+y+z=1, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishell" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe$_x$S$_{1-x}$, InP/ZnSe$_x$S$_{1-x}$/ZnS, InP/ZnSe/ZnS, InZnP/ZnS, InP/ZnSe$_x$Te$_{1-x}$/ZnS, InP/ZnSe$_x$Te$_{1-x}$, InZnP/ZnSe, InZnP/ZnSe/ZnS, InGaP/ZnS, InGaP/ZnSe, InGaP/ZnSe/ZnS.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticle is in the range from 0.1 wt. % to 90 wt. % based on the total amount of the composition, preferably from 5 wt. % to 70 wt. %, more preferably from 10 wt. % to 50 wt. %.

Such semiconducting light emitting nanoparticles comprising a core and at least one shell layer are known in the prior art documents.

For example, as described in Hens et al., Chem. Materials, 2015, 27, 4893-4898, Jeong et al., Applied Physics Letters, 2012, 101, 7, 073107, Char et al., ACS Nano, 2016, 10(4), pp 4754-4762, U.S. Pat. No. 9,109,163 B2, ACS Nano, 2013, 7(10), pp 9019-9026, Chem. Mater., 2011, 23(20), pp 4459-4463, and WO 2016/146719 A1.

In some embodiments of the present invention, the total amount of the polymer is in the range from 0.1 wt. % to 90 wt. % based on the total amount of the composition, preferably from 5 wt. % to 70 wt. %, more preferably from 10 wt. % to 50 wt. %.

Polysiloxane

According to the present invention, as a poly siloxane, a wide variety of publicly known poly siloxane, preferably organo polysiloxanes, can be used.

More preferably the polysiloxane comprises at least a silsesquioxane unit represented by following chemical formula (IX)

$$(R_7SiO_{1.5})_x \qquad (IX)$$

wherein $R_7$ is identical or different at each occurrence, selected from one or more member of the group consisting of a linear alkylene group or alkoxylene group having 1 to 40 carbon atoms, preferably 1 to 25 carbon atoms, more preferably 1 to 15 carbon atoms, a branched alkylene group or alkoxylene group having 3 to 40 carbon atoms, preferably 3 to 25 carbon atoms, more preferably 1 to 15 carbon atoms, a cycloalkane group having 3 to 40 carbon atoms, preferably 3 to 25 carbon atoms, more preferably 3 to carbon atoms, an alkenylene group having 2 to 40 carbon atoms, preferably 2 to 25 carbon atoms, an arylene group having 3 to 40 carbon atoms, preferably 3 to 25 carbon atoms, a hetero arylene group having 3 to carbon atoms, preferably 3 to 25 carbon atoms, and an aralkyl group having 4 to 40 carbon atoms, preferably 4 to 25 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

the symbol x is an integer, preferably x is in the range from 1 to 1000, more preferably from 5 to 500, even more preferably from 5 to 100.

This is suitable from the view point of improved moisture, UV resistivity of films, and/or higher transparency of visible light.

An alkyl group, if not defined otherwise, preferable is an alkyl group with 1 to 15 C atoms. An aralkyl group stands for -alkyl-aryl and preferably is a benzyl group. Aryl is preferably selected from benzene or naphthalene, and most preferably a benzene ring, where these groups are optionally substituted by Cl, F, 1-7 C alkyl, 1-7 C alkoxy, CN, —(CO)alkyl, —(CO)O-alkyl.

In a preferred embodiment of the present invention, $R_7$ is selected from the group consisting of methyl, ethyl, n-propyl, iso-propyl, t-butyl, n-hexyl, n-decyl, n-butyl, trifluoromethyl, 2,2,2-trifluoroethyl, 3,3,3-trifluoropropyl, cyclohexyl, phenyl, tolyl, and naphthyl groups.

Without wishing to be bound by theory, it is believed that if $R_7$ is phenyl group, it may lead better solubility of the polysiloxane in the solvent and reduce cracks in the fabricated film and if $R_7$ is methyl group, the raw materials can more easily be obtained from the market and may lead to higher hardness and better chemical stability of the fabricated film.

Such polysiloxanes like described in for example JP 2014-114176, WO 2012/157696 A1, WO 2013/151166 A, and SR-7010, OE-4705, OE-6630, OE-6635, OE-6665 resins (Dow Corning®) can be used as the polysiloxane of the present invention preferably. More preferably, OE-6630, OE-6635, or OE-6665 resin (Dow Corning®) is used.

Additional Ligand

In some embodiments of the present invention, optionally, the semiconducting light emitting nanoparticle can comprise a ligand.

Thus, in some embodiments of the present invention, the outermost surface of the core or the shell layers of the semiconducting light emitting nanoparticle can be over coated with one or more of ligands together with the polymer comprising at least an attaching group and the $1^{st}$ repeating unit, if desired.

In case one or more of said ligands attached onto the core or the outer most surface of the shell layer(s) of the semiconducting light emitting nanoparticle together with the polymer, the amount of the polymer is in the range from 30 wt. % to 99.9 wt % of the total ligands attached onto the outermost surface of the shell layer(s), with preferably being of in the range from 50 wt % to 95 wt %, more preferably it is in the range from 60 wt. % to 90 wt. %.

Without wishing to be bound by theory it is believed that such surface ligands may lead to disperse the nanosized fluorescent material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoic acid; carboxylic acids such as oleic acid, stearic acid, myristic acid; acetic acid and a combination of any of these. Furthermore, the ligands can include Zn-oleate, Zn-acetate, Zn-myristate, Zn-Stearate, Zn-laurate and other Zn-carboxylates. And Polyethylenimine (PEI) also can be used preferably.

Examples of surface ligands have been described in, for example, the laid-open international patent application No. WO 2012/059931 A.

In some embodiment of the present invention, the composition can further comprise one or more of additional materials.

Preferably the additional material is selected from the group consisting of organic light emitting materials, inorganic light emitting materials, charge transporting materials, scattering particles, matrix materials, preferably optically transparent polymers, anti-oxidants, radical quenchers, photo initiators and surfactants, and additional ligands.

For example, said activator can be selected from the group consisting of $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Bi^{3+}$, $Pb^{2+}$, $Mn^{2+}$, $Yb^{2+}$, $Sm^{2+}$, $Eu^{2+}$, $Dy^{2+}$, $Ho^{2+}$ and a combination of any of these, and said inorganic light emitting material such as an inorganic phosphor can be selected from the group consisting of sulfides, thiogallates, nitrides, oxynitrides, silicate, aluminates, apatites, borates, oxides, phosphates, halophosphates, sulfates, tungstenates, tantalates, vanadates, molybdates, niobates, titanates, germinates, halides based phosphors, and a combination of any of these.

Phosphors which may be employed as converters in the composition of the present invention are, for example: $Ba_2SiO_4:Eu^{2+}$, $Ba_3SiO_5:Eu^{2+}$, $(Ba,Ca)_3SiO_5:Eu^{2+}$, $BaSi_2N_2O_2:Eu, BaSi_2O_5:Pb^{2+}$, $Ba_3Si_6O_{12}N_2:Eu$, $Ba_xSr_{1-x}F_2:Eu^{2+}$ $(0\le x\le 1)$, $BaSrMgSi_2O_7:Eu^{2+}$, $BaTiP_2O_7$, $(Ba,Ti)_2P_2O_7:Ti$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^2$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha-Ca_3(PO_4)_2:Ce^{3+}$, $\beta-Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta-Ca_3(PO_4)_2:Eu^{2+}$, $Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha-Ca_3(PO_4)_2:Eu^{2+}$, $\beta-Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha-Ca_3(PO_4)_2:Pb^{2+}$, $\alpha-Ca_3(PO_4)_2:Sn^{2+}$, $\beta-Ca_3(PO_4)_2:Sn^{2+}$, $\beta-Ca_2P_2O_7:Sn, Mn$, $\alpha-Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+},F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSc_2O_4:Ce$, $Ca_3(Sc,Mg)_2Si_3O_{12}:Ce$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $Ca_3SiO_5:Eu^{2+}$, $(Ca,Sr)_3SiO_5:Eu^{2+}$, $(Ca,Sr)_3MgSi_2O_8:Eu^{2+}$, $(Ca,Sr)_3MgSi_2O_8:Eu^{2+}$, $Mn^{2+}$, $CaSiO_3:Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta-(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca, Zn, Mg)_3(PO_4)_2:Sn$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+$, $Cr$, $CdS:In$, $CdS:In, Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}Cr$, $Ce$, $GdNbO_4:Bi^{3+}$, $Gd_2O_2S:Eu^{3+}$, $Gd_2O_2Pr^{3+}$, $Gd_2O_2S:Pr, Ce, F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_8:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$ $(0\le x\le 1)$, $(Lu, Y)_3(Al, Ga, Sc)_5O_{12}:Ce$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2:Eu^{2+}$, $Mg_3Ca(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_{11}O_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $M_2MgSi_2O_7:Eu^{2+}$, (M=Ca, Sr, and/or Ba), $M_2MgSi_2O_7:Eu^{2+},Mn^{2+}$ (M=Ca, Sr, and/or Ba), $M_2MgSi_2O_7:Eu^{2+}$, $Zr^{4+}$ (M=Ca, Sr, and/or Ba), $M_2MgSi_2O_7:Eu^{2+}$, $Mn^{2+}$, $Zr^{4+}$ (M=Ca, Sr, and/or Ba), $Na_3Ce(PO_4)_2:Tb^{3+}$, $Na_{1.23}K_{0.42}Eu_{2.1}TiSi_4O_{11}:Eu^{3+}$, $Na_{1.23}K_{0.42}Eu_{0.12}TiSi_5O_{13}\cdot xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$ $(0\le x\le 2)$, $NaYF_4:Er^{3+}$, $Yb^{3+}$, $NaYO_2:Eu^{3+}$, $P46(70\%)+P47$ $(30\%)$, $\beta-SiAlON:Eu$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F, Cl, Br)$, $SrB_4O_7:Pb^{2+}$, $SrB_4O_7:Pb^{2+}$, $Mn^{2+}$, $SrB_8O_{13}:Sm$, $Sr_xBa_yCl_zAl_2O_{4-z/2}$: $Mn^{2+}$, $Ce^{3+}$, $SrBaSiO_4:Eu^{2+}$, $(Sr,Ba)_3SiO_5:Eu$, $(Sr,Ca)Si_2N_2O_2:Eu$, $Sr(Cl, Br, I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $Sr_{2-y}Ba_y$-$SiO_4$:Eu ($0 \leq y \leq 2$), $SrSi_2O_2N_2$:Eu, $SrGa_2S_4:Pb^{2+}$, $SrIn_2O_4$: $Pr^{3+}$, $Al^{3+}$, $(Sr, Mg)_3(PO_4)_2$:Sn, $SrMgSi_2O_6:Eu^{2+}$, $Sr_2MgSi_2O_7:Eu^{2+}$, $Sr_3MgSi_2O_8:Eu^{2+}$, $SrMoO_4$:U, $SrO.3B_2O_3:Eu^{2+}$, Cl, $\beta$-$SrO.3B_2O_3:Pb^{2+}$, $\beta$-$SrO.3B_2O_3$: $Pb^{2+},Mn^{2+}$, $\alpha$-$SrO.3B_2O_3:Sm^{2+}$, $Sr_6P_5BO_{20}$:Eu, $Sr_5(PO_4)_3Cl:Eu^{2+}$, $Sr_5(PO_4)_3Cl:Eu^{2+}$, $Pr^{3+}$, $Sr_5(PO_4)_3Cl$: $Mn^{2+}$, $Sr_5(PO_4)_3Cl:Sb^{3+}$, $Sr_2P_2O_7:Eu^{2+}$, $\beta$-$Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $\beta$-$Sr_3(PO_4)_2:Sn^{2+}$, $\beta$-$Sr_3(PO_4)_2:Sn^{2+}$, $Mn^{2+}(Al)$, $SrS:Ce^{3+}$, $SrS:Eu^{2+}$, SrS: $Mn^{2+}$, $SrS:Cu^+$, Na, $SrSO_4$:Bi, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO_4:Eu^{2+}$, $Sr_3SiO_5:Eu^{2+}$, $(Sr,Ba)_3SiO_5:Eu^{2+}$, $SrTiO_3:Pr^{3+}$, $SrTiO_3$: $Pr^{3+}$, $Al^{3+}$, $SrY_2O_3:Eu^{3+}$, $ThO_2:Eu^{3+}$, $ThO_2:Pr^{3+}$, $ThO_2$: $Tb^{3+}$, $YAl_3B_4O_{12}:Bi^{3+}$, $YAl_3B_4O_{12}:Ce^{3+}$, $YAl_3B_4O_{12}:Ce^{3+}$, Mn, $YAl_3B_4O_{12}:Ce^{3+},Tb^{3+}$, $YAl_3B_4O_{12}:Eu^{3+}$, $YAl_3B_4O_{12}$: $Eu^{3+}$, $Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}$: $Eu^{3r}$, $Y_4Al_2O_9:Eu^{3+}$, $Y_3Al_5O_{12}:Mn^{4+}$, $YAlO_3:Sm^{3+}$, $YAlO_3$: $Tb^{3+}$, $Y_3Al_5O_{12}:Tb^{3+}$, $YAsO_4:Eu^{3+}$, $YBO_3:Ce^{3+}$, $YBO_3$: $Eu^{3+}$, $YF_3:Er^{3+}$, $Yb^{3+}$, $YF_3:Mn^{2+}$, $YF_3:Mn^{2+}$, $Th^{4+}$, $YF_3$: $Tm^{3+}$, $Yb^{3+}$, $(Y,Gd)BO_3$:Eu, $(Y,Gd)BO_3$:Tb, $(Y,Gd)_2O_3$: $Eu^{3+}$, $Y_{1.34}Gd_{0.60}O_3$:(Eu,Pr), $Y_2O_3:Bi^{3+}$, $YOBr:Eu^{3+}$, $Y_2O_3$: Ce, $Y_2O_3:Er^{3+}$, $Y_2O_3:Eu^{3+}$, $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S$: $Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+}$, $Th^{4+}$, $YPO_4$: $V^{5+}$, $Y(P,V)O_4$:EU, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S$:Ag, $Zn_{0.6}Cd_{0.4}S$:Ag, $(Zn,Cd)S$:Ag, Cl, $(Zn,Cd)S$:Cu, $ZnF_2$: $Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, ZnO: $Ga^{3+}$, ZnO:Ga, ZnO—CdO:Ga, ZnO:S, ZnO:Se, ZnO:Zn, $ZnS:Ag^+$, $Cl^-$, ZnS:Ag, Cu, Cl, ZnS:Ag, Ni, ZnS:Au, In, ZnS—CdS (25-75), ZnS—CdS (50-50), ZnS—CdS (75-25), ZnS—CdS:Ag, Br, Ni, ZnS—CdS:$Ag^+$, Cl, ZnS—CdS:Cu, Br, ZnS—CdS:Cu, I, ZnS:Ch, $ZnS:Eu^{2+}$, ZnS:Cu, $ZnS:Cu^+$, $Al^{3+}$, $ZnS:Cu^+$, $Cl^-$, ZnS:Cu, Sn, $ZnS:Eu^{2+}$, $ZnS:Mn^{2+}$, ZnS:Mn, Cu, $ZnS:Mn^{2+}$, $Te^{2+}$, ZnS:P, $ZnS:P^{3-}$, $Cl^-$, ZnS: $Pb^{2+}$, $ZnS:Pb^{2+}$, $Cl^-$, ZnS:Pb, Cu, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4$:Mn, $Sb_2O_2$, $Zn_2SiO_4:Mn^{2+}$, P, $Zn_2SiO_4:Ti^{4+}$, $ZnS:Sn^{2+}$, ZnS:Sn, Ag, $ZnS:Sn^{2+}$, $Li^+$, ZnS:Te, Mn, ZnS—$ZnTe:Mn^{2+}$, $ZnSe:Cu^+$, Cl and $ZnWO_4$, more preferably $Y_3Al_5O_{12}Ce^{3+}$.

Such suitable inorganic fluorescent materials described above can be well known phosphors including nanosized phosphors, quantum sized materials like mentioned in the phosphor handbook, 2$^{nd}$ edition (CRC Press, 2006), pp. 155-pp. 338 (W. M. Yen, S. Shionoya and H. Yamamoto), WO2011/147517A, WO2012/034625A, and WO2010/095140A.

According to the present invention, as said organic light emitting materials, charge transporting materials, any type of publicly known materials can be used preferably. For example, well known organic fluorescent materials, organic host materials, organic dyes, organic electron transporting materials, organic metal complexes, and organic hole transporting materials.

For examples of scattering particles, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; inorganic hollow oxides such as hollow silica or a combination of any of these; can be used preferably.

In some embodiments of the present invention, said scattering particles and said phosphors can be added into the composition of the present invention.

Transparent Polymers

According to the present invention, a wide variety of publicly known transparent polymers suitable for optical devices can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

In a preferred embodiment of the present invention, any type of publicly known transparent polymers, described in for example, WO 2016/134820A can be used.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

Formulation

In another aspect, the present invention relates to a formulation comprising, essentially consisting of, or consisting of the composition, and at least one solvent, preferably it is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

In some embodiments, the formulation can further comprise an additional material. The details of the additional material are described in the section of "Additional material".

Use

In another aspect, the present invention relates to use of the composition, or a formulation, in an electronic device, optical device, in a biomedical device or for fabricating an electronic device, optical device or a biomedical device.

Optical Medium

In another aspect, the present invention further relates to an optical medium comprising the composition or the formulation, preferably the optical medium comprises the composition.

In some embodiments of the present invention, the optical medium can be an optical sheet, for example, a color filter, color conversion film, remote phosphor tape, or another film or filter.

According to the present invention, the term "sheet" includes film and/or layer like structured mediums.

In order to enhance out-coupling efficiency from an optical medium comprising the semiconducting light emitting nanoparticle, for example, a n optical film comprising a quantum sized material, several methods are proposed, such as incorporating scattering particles in the film and/or the adjacent films, reduce the refractive index of the film by incorporating hollow silica particles, and placing suitable shape structure (cf. Proceedings of SPIE, P.184, 5519-33, 2004). Among them, placing the structured film upon the film comprising quantum materials is the most suitable for large TV application in which local dimming technique is applied to achieve high dynamic range. The scattering particles are detrimental to the dimming technique, since the scattered light causes a color blur and reducing the refractive index of the film enough for a practical level is difficult because of the limited volume for the hollow silica particles. The combination of reducing the refractive index and placing the structured film can be also applied.

Optical Device

In another aspect, the invention further relates to an optical device comprising the optical medium.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

The term "emission" means the emission of electromagnetic waves by electron transitions in atoms and molecules.

Technical Effects of the Invention

1. The present invention provides a novel composition comprising one or more of semiconducting light emitting nanoparticles and silicone resin showing improved dispersibility of said semiconducting light emitting nanoparticles in the silicone resin.

2. The present invention provides a novel composition comprising one or more of semiconducting light emitting nanoparticles and silicone resin reducing or preventing polymerization of the silicone resin when storing it.

3. The present invention provides a novel composition comprising one or more of semiconducting light emitting nanoparticles and silicone resin showing long term stability and stable Quantum Yield of said semiconducting light emitting nanoparticles in the composition or the formulation.

4. The present invention provides a novel composition comprising one or more of semiconducting light emitting nanoparticles, showing better dispersibility of the semiconducting light emitting nanoparticles at higher concentration.

The working examples 1-7 below provide descriptions of the present invention, as well as an in-detail description of their fabrication.

WORKING EXAMPLES

Working Example 1: Fabrication of a Composition Comprising a Semiconducting Light Emitting Nanoparticle 1-1. Preparation of Red QM Dispersion in QE-6630 Part B Solution of 0.221 g of Cd-based red quantum materials (hereafter "QMs") (from Najing) in 5 ml of $CHCl_3$ is added dropwise to a solution of 0.22 g of dispersing agent (DISPERBYK-118) in 10 ml of $CHCl_3$. This mixture is stirred by magnetic stirrer at 60 deg. C. for 18 hours under nitrogen atmosphere. After that to this mixture 0.733 g of OE-6630 part B is added and $CHCl_3$ is evaporated by rotary evaporator, which afforded 1.13 g of clear dispersion of red QM in OE-6630 part B.

1-2. Fabrication of Red Quantum Material Embedded Silicone Film

To 0.5 g of red QM dispersion in OE-6630 part B obtained in 1-1 0.08 g of OE-6630 part A is added and stirred by magnetic stirrer at room temperature. The obtained composite material dispersion is coated on glass substrate by using bar coater. After that on the wet film of coated dispersion another glass substrate is placed and heated at 150 deg. C. in atmosphere for 1 hour on hot plate for curing.

Working Example 2: Fabrication of a Composition Comprising a Semiconducting Light Emitting Nanoparticle 2-1. Preparation of Green QM Dispersion in OE-6630 Part B Solution of 0.25 g of green QM in 5 ml of $CHCl_3$ is added dropwise to a solution of 0.245 g of dispersing agent (DISPERBYK-118) in 10 ml of $CHCl_3$. This mixture is stirred by magnetic stirrer at 60 deg. C. for 18 hours under nitrogen atmosphere. After that to this mixture 0.818 g of OE-6630 part B is added and $CHCl_3$ is evaporated by rotary evaporator, which afforded 1.261 g of clear dispersion of green QM in OE-6630 part B.

1-2. Fabrication of Green QM Embedded Silicone Film

To 0.5 g of green QM dispersion in OE-6630 part B obtained in 2-1 0.08 g of OE-6630 part A is added and stirred by magnetic stirrer at room temperature. The obtained composite material dispersion is coated on glass substrate by using bar coater. After that on the wet film of coated dispersion another glass substrate is placed and heated at 150 deg. C. in atmosphere for 1 hour on hot plate for curing.

Working Example 3: Quantum Yield Calculation

The absolute quantum yield of the samples obtained in the working examples 1, 2 are evaluated with the absolute PL quantum yields measurement system C9920-02 (Hamamatsu) at room temperature, and following formula is used.

Quantum yield (QY)=emitted photon number from the sample/absorbed photon number of the sample.

Table 3 shows the results of the QY measurements.

TABLE 3

QY of QMs in OE-6630 part B dispersion and in composite film after heat cure.

| | quantum material | in toluene (original value) | in OE-6630 part B | in heat cured composite film |
|---|---|---|---|---|
| Example 1 | red | 0.9 | 0.62 | 0.68 |
| Example 2 | green | 0.72 | 0.71 | 0.4 |

Comparative Example 1: Fabrication of a Composition Comprising a Semiconducting Light Emitting Nanoparticle 3-1. Preparation of Red Quantum Material Dispersion in QE-6630 Part B Solution of 0.203 g of Cd-based red quantum materials (hereafter "QMs") (from Najing) in 5 ml of $CHCl_3$ is added dropwise to a solution of 0.358 g of dispersing agent (DISPERBYK-163) in 10 ml of $CHCl_3$. This mixture is stirred by magnetic stirrer at 60 deg. C. for 18 hours under nitrogen atmosphere. After that to this mixture 0.843 g of OE-6630 part B is added and $CHCl_3$ is evaporated by rotary evaporator, which afforded 1.209 g of product. This product is inhomogeneous and separated to two phases, one of which is an insoluble polymer with red color and another is a liquid material without color.

3-2. Preparation of Green QM Dispersion in OE-6630 Part B

Solution of 0.839 g of red QM in 21 ml of $CHCl_3$ is added dropwise to a solution of 1.454 g of dispersing agent (DISPERBYK-163) in 42 ml of $CHCl_3$. This mixture is stirred by magnetic stirrer at 60 deg. C. for 19 hours under nitrogen atmosphere. After that to this mixture 3.456 g of OE-6630 part B is added and $CHCl_3$ is evaporated by rotary evaporator, which afforded 5.56 g of product. This product is inhomogeneous and separated to two phases, one of which is an insoluble polymer with red color and another is a liquid material without color.

Working Example 4: Dispersibility Observation

Table 4 shows the dispersibility of QM in silicone resin.

TABLE 4

| Example 1 | homogeneously dispersed in the resin |
|---|---|
| Example 2 | homogeneously dispersed in the resin |

TABLE 4-continued

| Comparative example 1 | In homogeneously dispersed in the resin and the composition is separated to two phases. |
|---|---|

Table 5 shows microscopic image observation of the silicone films after heat cure treatment obtained in the working examples 1 and 2 are respectively. Concentration of QMs in films is 17 wt. %. They clearly show that QMs homogeneously disperse in silicone films.

TABLE 5

| Example 1 | homogeneously dispersed in the silicone film |
|---|---|
| Example 2 | homogeneously dispersed in the silicone film |

Working Example 5: Preparation of Composition

Red QM dispersion in OE-6630 part B is obtained in the same manner as described in the working example 1-1 expect for that 5 wt % of the red quantum materials based on the total amount of the composition are added. Then, it is mixed with OE-6630 part A and YAG phosphor $Y_3Al_5O_{12}$:$Ce^{3+}$. Amount of the used materials in the obtained composition is disclosed in the table 6.

TABLE 6

| Material | wt. % |
|---|---|
| OE-6630 A | 6.4 |
| Red QM dispersion in OE-6630 part B | 26.6 |
| YAG phosphor | 65.0 |

Working Example 6: Preparation of Composition

Red QM dispersion in OE-6630 part B is obtained in the same manner as described in the working example 1-1 expect for that 12 wt % of the red quantum materials based on the total amount of the composition are added. And then, it is mixed with OE-6630 part A and YAG phosphor $Y_3Al_5O_{12}$:$Ce^{3+}$.

Amount of the used materials in the obtained composition is disclosed in the table 7.

TABLE 7

| Material | wt. % |
|---|---|
| OE-6630 A | 5.8 |
| Red QM dispersion in OE-6630 part B | 29.2 |
| YAG phosphor | 65.0 |

Working Example 7: Preparation of Composition

Red QM dispersion in OE-6630 part B is obtained in the same manner as described in the working example 1-1 expect for that 19 wt % of the red quantum materials based on the total amount of the composition are added. And then, it is mixed with OE-6630 part A and YAG phosphor $Y_3Al_5O_{12}$:$Ce^{3+}$.

Amount of the used materials in the obtained composition is disclosed in the table 8.

TABLE 8

| Material | wt. % |
| --- | --- |
| OE-6630 A | 5.0 |
| Red QM dispersion in OE-6630 part B | 30 |
| YAG phosphor | 65.0 |

The invention claimed is:

1. A composition comprising at least one semiconducting light emitting nanoparticle, a polymer, and a poly siloxane,
    wherein the nanoparticle comprises at least a core, optionally one or more shell layers,
    wherein the polymer comprises at least an attaching group selected from one or more member of the group consisting of phosphine groups, phosphine oxide groups, phosphate groups, phosphonate groups, carboxyl groups, hetero cyclic groups, silane groups, sulfonic acids, hydroxyl groups, and phosphonic acids,
    and
    a $1^{st}$ repeating unit represented by following chemical formula (II); (III), (IV), (V), (VI), (VII) or (VIII),

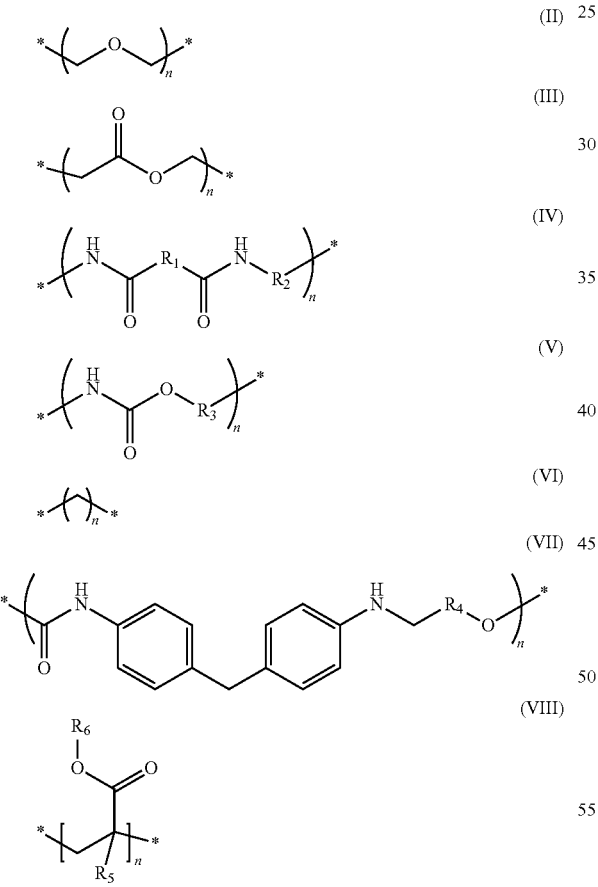

wherein
$R_1$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_2$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_3$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_4$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_5$ is a hydrogen atom, or methylene;

$R_6$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

"*" represents a connecting point; "n" is an integer.

2. The composition according to claim 1, wherein the polymer further comprises a $2^{nd}$ repeating unit represented by following chemical formula (II); (III), (IV), (V), (VI), (VII) or (VIII),

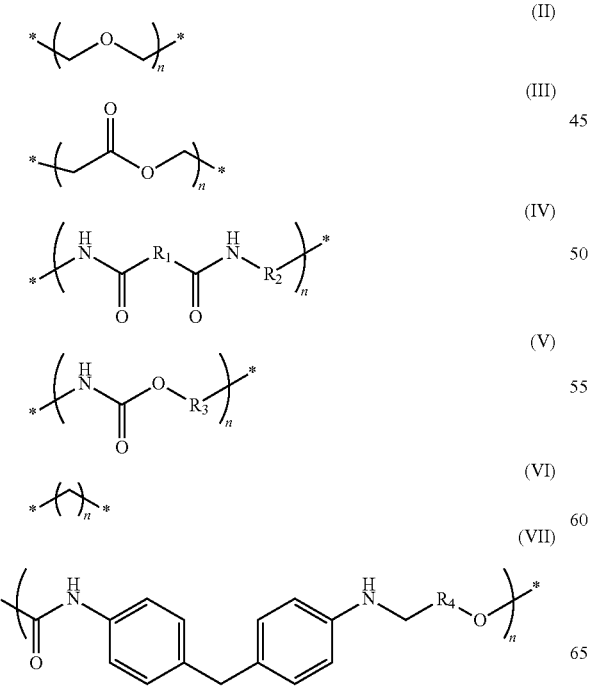

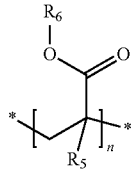

wherein $R_1$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

$R_2$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_3$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_4$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

$R_5$ is a hydrogen atom, or methylene;

$R_6$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$;

"*" represents the connecting point; "n" is an integer, and said $1^{st}$ repeating unit and said $2^{nd}$ repeating unit are different of each other.

3. The composition according to claim 1, wherein the polymer is represented by following formula (X), $$A(B)_xC(D)_yEF \qquad (X)$$

wherein symbol A is the attaching group; symbol B is a $1^{st}$ linker, symbol C is the $1^{st}$ repeating unit; symbol D is a $2^{nd}$ linker, symbol E is the $2^{nd}$ repeating unit; symbol F is a tail of the polymer, x is 0 or 1, y is 0 or 1.

4. The composition according to claim 3, wherein in the polymer represented by formula (X), symbol B is a $1^{st}$ linker that is a linear alkylene group having 1 to 25 carbon atoms, or a linear alkenylene group having 1 to 25 carbon atoms; symbol D is a $2^{nd}$ linker that is a linear alkylene group having 1 to 25 carbon atoms, or a linear alkenylene group having 1 to 25 carbon atoms; and symbol F is a tail of the polymer selected from the group consisting of a hydrogen atom, a linear alkyl group having 1 to 25 carbon atoms, a linear alkoxy group having 1 to 25 carbon atoms and a linear alkenyl group having 1 to 25 carbon atoms.

5. The composition according to claim 1, said $1^{st}$ repeating unit is represented by formula (III) and the $2^{nd}$ repeating unit is represented by chemical formula (II).

6. The composition according to claim 1, wherein at least one of the shell layer comprises a $1^{st}$ element of group 12 of the periodic table, and a $2^{nd}$ element of group 16 of the periodic table.

7. The composition according to claim 1, wherein at least one shell layer is represented by following formula (XI), $$ZnS_xSe_yTe_z, \qquad (XI)$$

wherein $0\le x\le 1$, $0\le y\le 1$, and $x+y+z=1$.

8. The composition according to claim 1, wherein said shell layers of the semiconducting light emitting nanoparticle are double shell layers.

9. The composition according to claim 1, wherein the composition further comprises at least one additional material, selected from the group consisting of organic light emitting materials, inorganic light emitting materials, charge transporting materials, scattering particles, optically transparent polymers, anti-oxidants, radical quenchers, polymerization initiators, and additional ligands.

10. The composition according to claim 1, wherein the composition comprises a plurality of semiconducting light emitting nanoparticles.

11. The composition according to claim 1, wherein the total amount of the semiconducting light emitting nanoparticle is in the range from 0.1 wt. % to 90 wt. % based on the total amount of the composition.

12. The composition according to claim 1, wherein the total amount of the polymer is in the range from 0.1 wt. % to 90 wt. % based on the total amount of the composition.

13. A formulation comprising at least the composition according to claim 1, and a solvent.

14. An electronic device, optical device, in a biomedical device or for fabricating an electronic device, optical device or a biomedical device, comprising a composition according to claim 1.

15. An optical medium comprising said composition according to claim 1.

16. An optical device comprising said optical medium according to claim 15.

17. A composition according to claim 1, wherein the attaching group is a phosphonate group, a phosphate group, or a carboxyl group.

18. A composition according to claim 17, wherein the phosphate group is of formula (I):

19. The composition according to claim 1, wherein n is 1 to 1000.

20. The composition according to claim 1, wherein the poly siloxane is an organo polysiloxane.

21. The composition according to claim 20, wherein the organo polysiloxane comprises at least a silsesquioxane unit represented by following chemical formula (IX):

$$(R_7SiO_{1.5})_x \quad (IX)$$

wherein $R_7$ is identical or different at each occurrence, selected from one or more member of the group consisting of a linear alkylene group or alkoxylene group having 1 to 40 carbon atoms, a branched alkylene group or alkoxylene group having 3 to 40 carbon atoms, a cycloalkane group having 3 to 40 carbon atoms, an alkenylene group having 2 to 40 carbon atoms, an arylene group having 3 to 40 carbon atoms, a hetero arylene group having 3 to 40 carbon atoms, and an aralkyl group having 4 to 40 carbon atoms, which may in each case be substituted by one or more radicals $R^a$, where one or more non-adjacent $CH_2$ groups may be replaced by $R^aC=CR^a$, $C\equiv C$, $Si(R^a)_2$, $Ge(R^a)_2$, $Sn(R^a)_2$, $C=O$, $C=S$, $C=Se$, $C=NR^a$, $P(=O)(R^a)$, SO, SO2, $NR^a$, OS, or $CONR^a$ and where one or more H atoms may be replaced by D, F, Cl, Br, I, CN or $NO_2$, or an aromatic or heteroaromatic ring system having 5 to 60 aromatic ring atoms, which may be substituted by one or more radicals $R^a$, $R^a$ is at each occurrence, identically or differently, H, D, or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another, and the symbol x is an integer.

* * * * *